United States Patent
Zeng et al.

(10) Patent No.: US 6,828,177 B2
(45) Date of Patent: Dec. 7, 2004

(54) GATE PAD PROTECTION STRUCTURE FOR POWER SEMICONDUCTOR DEVICE AND MANUFACTURING METHOD THEREFOR

(75) Inventors: Jun Zeng, Torrance, CA (US); Ming-Jiang Zhou, Torrance, CA (US); Tzong-Shiann Wu, Torrance, CA (US)

(73) Assignee: Pyramis Corporation, Torrance, CA (US)

( * ) Notice: Subject to any disclaimer, the term of this patent is extended or adjusted under 35 U.S.C. 154(b) by 0 days.

(21) Appl. No.: 10/334,754

(22) Filed: Dec. 30, 2002

(65) Prior Publication Data

US 2003/0157753 A1 Aug. 21, 2003

(30) Foreign Application Priority Data

Feb. 21, 2002 (TW) ........................................ 91103066 A

(51) Int. Cl.[7] ............................................. H01L 21/332
(52) U.S. Cl. ........................ 438/135; 438/139; 438/140
(58) Field of Search ............................... 438/135, 139, 438/140, 231, 232, 302, 305, 519, 527; 257/296, 297, E29.027, E29.066, E29.197, E29.201

(56) References Cited

U.S. PATENT DOCUMENTS

| 5,393,676 | A | * | 2/1995 | Anjum et al. | 438/301 |
|---|---|---|---|---|---|
| 6,090,653 | A | * | 7/2000 | Wu | 438/231 |
| 6,187,619 | B1 | * | 2/2001 | Wu | 438/224 |
| 6,187,643 | B1 | * | 2/2001 | Borland | 438/302 |
| 2002/0149067 | A1 | * | 10/2002 | Mitros et al. | 257/409 |
| 2004/0165459 | A1 | * | 8/2004 | Lee et al. | 365/200 |

* cited by examiner

*Primary Examiner*—W. David Coleman
*Assistant Examiner*—Khiem Nguyen
(74) *Attorney, Agent, or Firm*—Kirton & McConkie; Michael F. Krieger

(57) ABSTRACT

A method for manufacturing a gate pad protection structure applied in a power semiconductor device is provided. The method includes steps of (a) forming a gate oxide layer on a substrate, (b) forming a polysilicon layer on the gate oxide layer, (c) forming a polysilicon window and a polysilicon window array on the polysilicon layer, and (d) performing an ion implantation via the polysilicon window and the polysilicon window array.

18 Claims, 2 Drawing Sheets

GATE PAD PROTECTION STRUCTURE FOR POWER SEMICONDUCTOR DEVICE AND MANUFACTURING METHOD THEREFOR

RELATED APPLICATIONS

This application claims priority to Taiwan Application Serial No. 091103066, filed Feb. 21, 2002.

FIELD OF THE INVENTION

This invention relates to a gate pad protection structure and a manufacturing method therefor, and more particular to a gate pad protection structure for a power semiconductor device and a manufacturing method therefor.

BACKGROUND OF THE INVENTION

Conventionally, the power semiconductor devices, e.g., MOSFET (Motel-Oxide-Semiconductor Field-Effect Transistor), IGBT (Isolated Gate Bipolar Transistor), or any other power semiconductor device having a gate pad structure, etc., generally has a gate pad protection structure for protecting and also avoiding the gate oxide layer being broken by the electric stress. Please refer to FIG. 1, it illustrates the schematic view of the gate pad protection structure of a power semiconductor device according to the prior art. As shown in FIG. 1, a thin gate oxide layer 11 is first formed on a silicon substrate 10. Then, a polysilicon layer 12 is formed on the thin gate oxide layer 11 by a deposition. Sequentially, a photolithographic and an etching processes are executed on the polysilicon layer 12 of an active area to form a polysilicon window 1101. Then, ion implantations are executed to form well area 101, source area 102 and shallow junction area 103 on the silicon substrate 10. Continuously, a dielectric layer 13 is formed on the polysilicon layer 12, and then a portion of the dielectric layer 13 is removed by a photolithographic and an etching processes. Finally, a metal layer 14 as shown in FIG. 1 is formed on the dielectric layer 13 to form a gate pad structure 15. However, when the conventional power semiconductor device is applied a high voltage, the gate pad structure described above should be protected to avoid the gate oxide layer being broken by the high electric stress. The conventional protecting method is to form a deep junction 104 directly under the gate pad structure and thus forms a p-n junction on the silicon substrate 10. This method will obviously reduce the field stresses of the surface of the silicon substrate and the area of the gate oxide layer. But this conventional method needs to increase a step of photo mask for forming the deep junction 104 in the process, especially for low voltage power semiconductor devices.

It is obviously known that how to provide an effective gate pad protection structure and to avoid the persecution of increasing one more step is a significant developing direction for the present invention. Thus, because of the technical defects described above, the applicant keeps on carving unflaggingly to develop a "gate pad protection structure for power semiconductor device and manufacturing method therefor" through wholehearted experience and research.

SUMMARY OF THE INVENTION

It is an object of the present invention to provide a gate pad protection structure for a power semiconductor device and a manufacturing method therefore for protecting and avoiding the gate oxide layer being broken by the electric stress.

It is another object of the present invention to provide a gate pad protection structure and a method therefor by forming a polysilicon window array on a polysilicon layer of an inactive area.

In accordance with an aspect of the present invention, a method for manufacturing a gate pad protection structure applied in a power semiconductor device, includes steps of (a) forming a gate oxide layer on a substrate, (b) forming a polysilicon layer on the gate oxide layer, (c) forming a polysilicon window and a polysilicon window array on the polysilicon layer, and (d) performing ion implantations via the polysilicon window and the polysilicon window array.

Preferably, the substrate is made of silicon.

Preferably, the power semiconductor device is one of MOSFET (Metal-Oxide-Semiconductor Field-Effect Transistor) and IGBT (Isolated-Gate-Bipolar-Transistor) and any other power devices with gate-pad structures.

Preferably, the step (b) is executed by a chemical deposition.

Preferably, the step (c) is executed by a photolithographic and an etching processes.

Preferably, the step (d) further includes steps of (d1) forming a dielectric layer on the polysilicon layer and removing the dielectric layer over the polysilicon window, and (d2) forming a metal layer on the dielectric layer to form the gate pad protection structure.

Certainly, the step (d1) can be executed by a photolithographic and an etching processes.

Preferably, the step (d) is executed by a photo mask and ion implantations to form the field implantation area on the substrate corresponding to the polysilicon window and form the field implantation area cell array on the substrate corresponding to the polysilicon window array.

Certainly, the field implantation area cell array has plural field implantation area cells each of which is partially overlapped with a respective adjacent one to make an electrical short circuit and a ground connection.

Certainly, each of plural field implantation area cells substantially has an identical structure to that of the field implantation area.

In accordance with another aspect of the present invention, a gate pad protection structure for a power semiconductor device, includes a substrate, a field implantation area disposed in the substrate, a field implantation area cell array disposed in the substrate and having plural field implantation area cells each of which substantially has an identical structure to that of the field implantation area, wherein the field implantation area cell array and the field implantation area are simultaneously formed in the substrate, and a gate pad structure having a polysilicon window and a polysilicon window array formed on the substrate for protecting the gate pad structure by the field implantation area cell array.

Prefersbly, the substrate is made of silicon.

Prefersbly, the power semiconductor device is one of MOSFET (Metal-Oxide-Semiconductor Field-Effect Transistor) and IGBT (Isolated-Gate-Bipolar-Transistor) and any other power devices with gate-pad structures.

Certainly, each of plural field implantation area cells can be overlapped with a respective adjacent one to make an electrical short circuit and a ground connection.

The above objects and advantages of the present invention will become more readily apparent to those ordinarily skilled in the art after reviewing the following detailed descriptions and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 2:
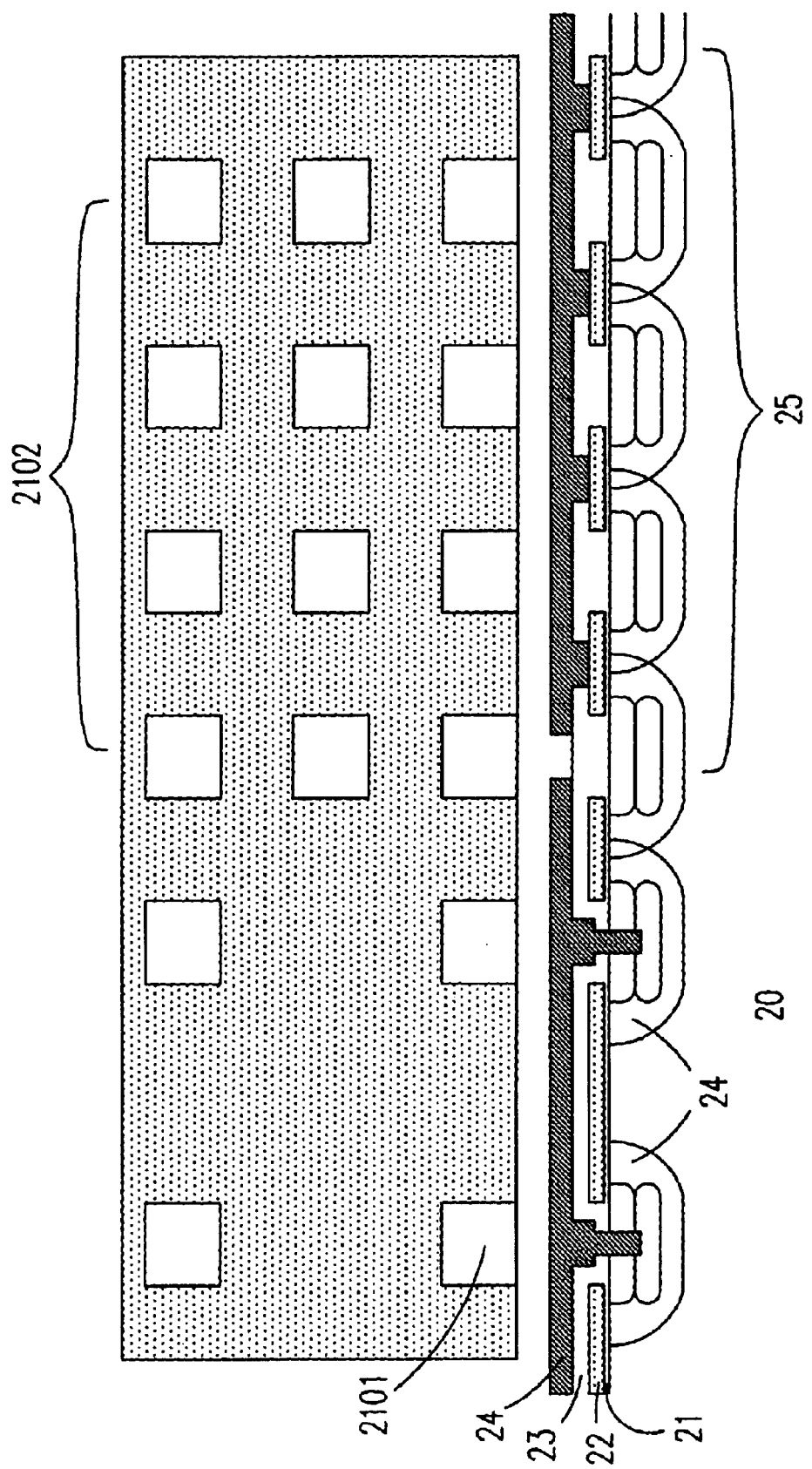
FIG. 2 shows the schematic view of a gate pad protection structure of a power semiconductor device in a preferred embodiment according to the present invention.

Please refer to FIG. 2 illustrating a schematic view of the gate pad protection structure of a power semiconductor device in a preferred embodiment according to the present invention. As shown in FIG. 2, a thin gate oxide layer 21 is first formed on a silicon substrate 20. Then, a polysilicon layer 22 is formed on the thin gate oxide layer 21 by a deposition. Sequentially, a polysilicon window 2101 is formed on the polysilicon layer of an active area and a polysilicon window array 2102 is formed on an inactive area by a photolithographic and an etching processes. And, a photo mask and ion implantation processes are executed to form a field implantation area 24 and a field implantation area cell array 25. Continuously, a dielectric layer 23 is formed on the polysilicon layer 22, and then a portion of the dielectric layer 23 is removed by a photolithographic and an etching processes. Finally, a metal layer 24 is formed on the dielectric layer 23 to complete the gate pad protection structure as shown in FIG. 2.

Figure 1:
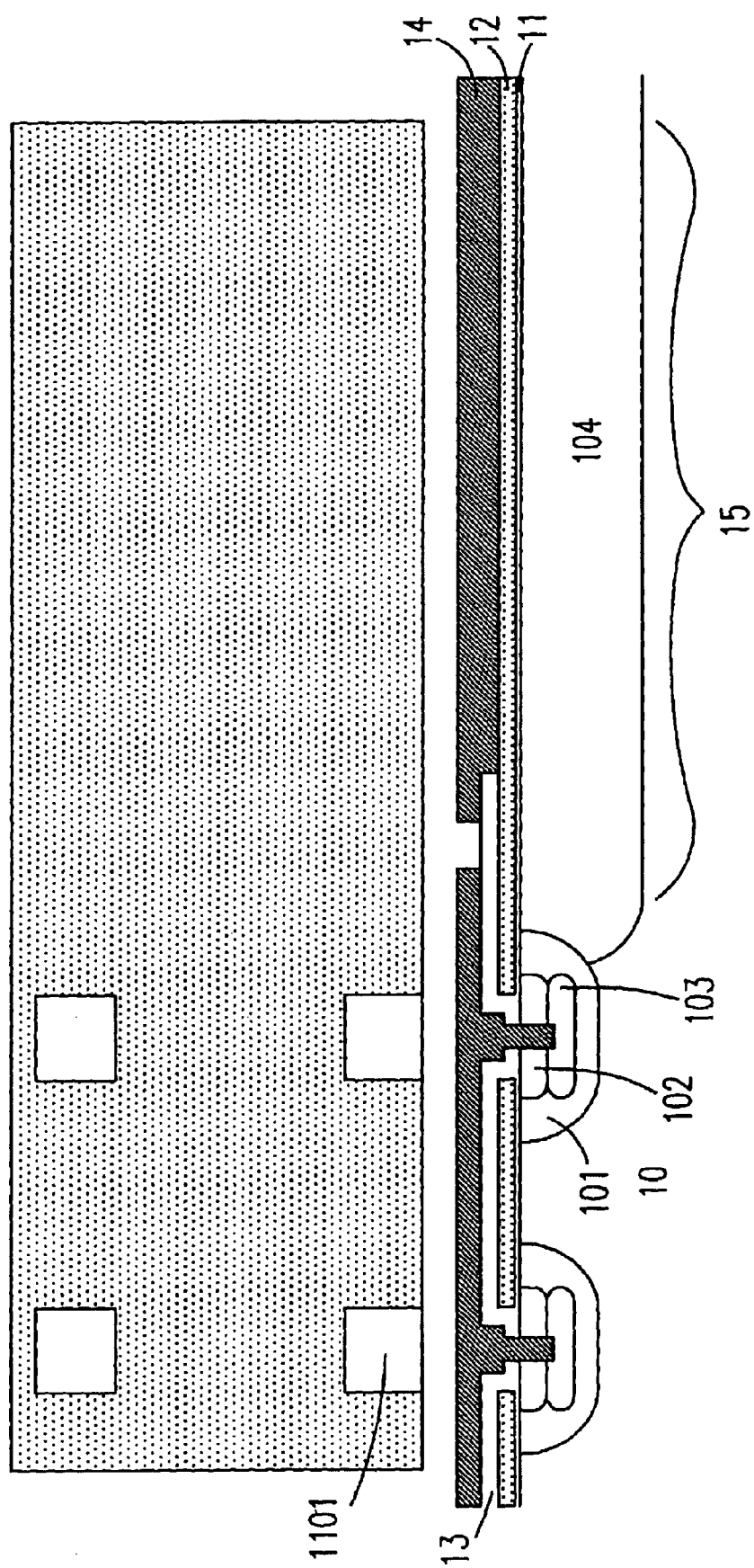
FIG. 1 shows the schematic view of a gate pad protection structure of a power semiconductor device according to the prior art.

The major difference between the prior and the present invention is that the present invention utilizes the cell array formed by plural field implantation area cells of the field implantation area 24 which are the same as that of the active area to substitute for the structure shown in FIG. 1. And these cells have a partially overlapped arrangement with the adjacent ones to make an electrical short circuit and a ground connection. Because the array of the cells can be formed simultaneously with the formation of that of the active area, the unnecessary photo mask would not be needed any more. Consequently, the present invention simplifies the manufacturing process, so that it owns the industrial value extremely.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for manufacturing a gate pad protection structure in an inactive region of a power semiconductor device, the method comprising steps of:
    (a) forming a gate oxide layer on a substrate;
    (b) forming a polysilicon layer on said gate oxide layer;
    (c) simultaneously forming a polysilicon window in an active region of said polysilicon layer and a polysilicon window array in an inactive region of said polysilicon layer; and
    (d) performing ion implantations simultaneously via said polysilicon window and said polysilicon window array; and
    (e) using an overlapping field implantation area cell array to form said gate pad protection structure in the inactive region of the power semiconductor device.

2. A method according to claim 1 wherein said substrate is made of silicon.

3. A method according to claim 1 wherein said power semiconductor device is one of MOSFET (Metal-Oxide-Semiconductor Field-Effect Transistor) and IGBT (Isolated Gate Bipolar Transistor) and any other power devices with gate-pad structures.

4. A method according to claim 1 wherein said step (b) is executed by a chemical deposition.

5. A method according to claim 1 wherein said step (c) is executed by a photolithographic and an etching processes.

6. A method according to claim 1 wherein said step (d) further comprises steps of:
    (d1) forming a dielectric layer on said polysilicon layer and removing said dielectric layer over said polysilicon window; and
    (d2) forming a metal layer on said dielectric layer to form said gate pad protection structure.

7. A method according to claim 6 wherein said step (d1) is executed by a photolithographic and an etching processes.

8. A method according to claim 1 wherein said step (d) is executed by a photo mask and ion implantations to form said field implantation area on said substrate corresponding to said polysilicon window and form said field implantation area cell array on said substrate corresponding to said polysilicon window array.

9. A method according to claim 8 wherein said field implantation area cell array has plural field implantation area cells, each of which is partially overlapped with a respective adjacent one to make an electrical short circuit and a ground connection.

10. A method according to claim 9 wherein said each of said plural field implantation area cells substantially has an identical structure to that of said field implantation area.

11. A gate pad protection structure in an inactive region of a power semiconductor device, the gate pad protection structure comprising:
    a substrate having a gate oxide layer formed on said substrate and a polysilicon layer formed on said gate oxide layer;
    a field implantation area disposed in said substrate;
    an overlapping field implantation area cell array disposed in said substrate and having plural field implantation area cells, each of which substantially has an identical structure to that of said field implantation area, wherein said overlapping field implantation area cell array and said field implantation area are simultaneously formed in said substrate; and
    a gate pad structure in an inactive region of the power semiconductor device having a polysilicon window in an active region of said polysilicon layer and a polysilicon window array formed in an inactive region of said polysilicon layer for protecting said gate pad structure by said field implantation area cell array.

12. A structure according to claim 11 wherein said substrate is made of silicon.

13. A structure according to claim 11 wherein said power semiconductor device is one of MOSFET (Metal-Oxide-Semiconductor Field-Effect Transistor) and IGBT (Isolated-Gate-Bipolar-Transistor) and any other power devices with gate-pad structures.

14. A structure according to claim 11 wherein each of said plural field implantation area cells is overlapped with a respective adjacent one to make an electrical short circuit and a ground connection.

15. A gate pad protection structure in an inactive region of a power semiconductor device, the gate pad protection structure comprising:

a substrate having a gate oxide layer formed on said substrate and a polysilicon layer formed on said gate oxide layer;

a field implantation area disposed in said substrate;

a field implantation area cell array disposed in said substrate and having plural field implantation area cells having a partially overlapping arrangement between adjacent area cells of said plural field implantation area cells, wherein each of said plural field implantation area cells has an identical structure to that of said field implantation area, and wherein said field implantation area cell array and said field implantation area are simultaneously formed in said substrate; and a gate pad structure in an inactive region of the power semiconductor device having a polysilicon window in an active region of said polysilicon layer and a polysilicon window array formed in an inactive region of said polysilicon layer for protecting said gate pad structure by said field implantation area cell array.

16. A structure according to claim 15, wherein said substrate is made of silicon.

17. A structure according to claim 15, wherein said power semiconductor device is one of MOSFET (Metal-Oxide-Semiconductors Field-Effect Transistor) and IGBT (Isolated-Gate-Bipolar-Transistor) and any other power devices with gate-pad structures.

18. A structure according to claim 15, wherein said structure is manufactured using a process that comprises:

(a) forming a gate oxide layer on a substrate;

(b) forming a polysilicon layer on said gate oxide layer;

(c) simultaneously forming a polysilicon window and a polysilicon window array on said polysilicon layer; and (d) performing ion implantations simultaneously via said polysilicon window and said polysilicon window array.

* * * * *

UNITED STATES PATENT AND TRADEMARK OFFICE
CERTIFICATE OF CORRECTION

PATENT NO. : 6,828,177 B2
APPLICATION NO. : 10/334754
DATED : December 7, 2004
INVENTOR(S) : Jun Zeng et al.

It is certified that error appears in the above-identified patent and that said Letters Patent is hereby corrected as shown below:

Title Pg, Item (73) Assignee
Please add additional Assignee: Delta Electronics, Inc.

Signed and Sealed this

Twenty-fifth Day of November, 2008

JON W. DUDAS
*Director of the United States Patent and Trademark Office*